United States Patent [19]
Davis et al.

[11] Patent Number: 5,426,452
[45] Date of Patent: Jun. 20, 1995

[54] LASER DIODE OPERATED IN AMPLITUDE MODULATION AND PULSE AMPLITUDE MODES

[75] Inventors: James G. Davis; James A. Hardy, both of Rochester, N.Y.

[73] Assignee: Eastman Kodak Company, Rochester, N.Y.

[21] Appl. No.: 62,082

[22] Filed: May 17, 1993

[51] Int. Cl.$^6$ .................................. H04N 1/21
[52] U.S. Cl. ........................................ 347/247
[58] Field of Search ............... 346/1.1, 107 R, 108, 346/160, 76 L; 372/26, 9, 38, 29

[56] References Cited

U.S. PATENT DOCUMENTS

| | | | |
|---|---|---|---|
| 4,375,065 | 2/1983 | Ohara | 346/108 |
| 4,679,057 | 7/1987 | Hamada | 346/76 |
| 4,754,291 | 6/1988 | Horikawa | 346/108 |
| 4,774,710 | 9/1988 | Davis et al. | 372/9 |
| 4,799,069 | 1/1992 | Sasaki et al. | 346/108 |
| 4,806,946 | 2/1989 | Ohnishi | 346/1.1 |
| 4,905,022 | 2/1990 | Nagasawa | 346/108 |
| 4,987,426 | 1/1991 | Ota et al. | 346/108 |
| 5,081,631 | 1/1992 | Dhurjaty | 372/9 |
| 5,371,524 | 12/1994 | Herczeg et al. | 346/107 R |

OTHER PUBLICATIONS

"Uniform Perceptual Quantization: Applications to Digital Radiography," M. I. Sezan, K. Yip, S. J. Daly, IEEE Transactions on Systems, Man, and Cybernetics, vol. SMC-17, No. 4, Jul./Aug. 1987, pp. 622–634.

Primary Examiner—Mark J. Reinhart
Attorney, Agent, or Firm—William F. Noval

[57] ABSTRACT

A laser imaging apparatus includes a laser diode which is controlled to produce a laser beam the power of which varies linearly as a function of a digital image input signal. The laser beam is deflected by scanning optics to expose photosensitive media such as film. When the digital image input signal is in a first range of values to operate the laser diode in its linear region, the laser diode is controlled to operate in an amplitude modulation mode. When the digital image input signal is in a second, lower, range of values which would operate the laser diode in its non-linear operating region, the laser diode is controlled to operate in the linear region but in a pulse amplitude modulation mode.

5 Claims, 4 Drawing Sheets

LASER DIODE OPERATED IN AMPLITUDE MODULATION AND PULSE AMPLITUDE MODES

TECHNICAL FIELD

In general, the present invention relates to laser printer apparatus for exposing photosensitive media by means of a scanning laser. More particularly, the present invention relates to laser diode printer apparatus wherein the exposure characteristics of a laser diode are optimized so that the maximum range of exposure (Emax-Emin) is obtained without the use of the light emitting diode (LED) region of the laser diode.

BACKGROUND ART

A laser diode operates in two distinct regions which includes a laser region and a LED region. As shown in FIG. 1, the laser region is characterized by a linear relationship between the laser diode drive current above a threshold current, and the output illuminative power. In the LED region, the relationship between the drive current and the output illuminative power is non-linear, and the change in output illuminative power is very small for a change in current, relative to the laser region of operation. A means of using laser diodes for exposure in laser printers, is to drive the laser diode with a digital to analog converter (DAC) which equally divides the current into $2^N - 1$ values, where N equals the number of bits input to the DAC. Because the laser diode efficiency (which is measured as milliwatts output power, per unit milliamp of input current) is very small in the LED region, a large range of input signal code values results in very little change in exposure.

One type of laser printer uses an n bit (e.g., 12 bit) DAC which drives an exposure device (a He-Ne gas laser and acoustooptic modulator or laser diode). The exposure device then prints exposures upon photosensitive media such as film. An output lookup table is constructed, through which the data is mapped prior to digital to analog conversion. The lookup table is calculated to force a linear mapping from code value to film density.

In the high density region of the Density vs. Log Exposure (D LogE) film curve, the delta exposure for a constant delta density is much greater than in the low density region. As a result, the output lookup table maps a number of input code values to a single output code value in the high density or high exposure region. This results in an inefficient use of code values for exposure.

It is known that the threshold of visibility for a small change in luminance is relatively constant in the luminance region over which radiographs are viewed (see M. I. Sezan, K. Yip, S. J. Daly, "Uniform Perceptual Quantization: Applications to Digital Radiography," *IEEE Transactions on Systems, Man, and Cybernetics*, Vol. SMC-17, No. 4, Jul/Aug 1987, pp. 622-634). Because this delta luminance parameter is related by a constant factor to delta density, the optimum laser printer would use an exposure means which, in a monotonically increasing manner, maps each code value to a unique density value, and for which delta density is a constant. Thus, based upon the D LogE curve of the film, the optimum code value to exposure curve can be calculated.

The multimode behavior of the laser diode in the LED region, in addition to the low efficiency, make the LED region undesirable for exposure. In the LED region, the wavelength is lower than in the laser region, and much of the illuminative power is not at the fundamental mode of operation. Since the density of exposed and developed film is dependent upon the wavelength of exposure, the change in wavelength adds an additional source of error in the exposure process.

In U.S. Pat. No. 4,774,710, issued Sep. 27, 1988, inventors Davis and Hardy (see also U.S. Pat. No. 4,987,426, issued Jan. 22, 1991, inventors Ota et al.), it was suggested that at power levels below a cutoff point chosen to be in the laser region of operation, but just above the transition to the LED region, the laser be pulse width modulated to linearly extend the exposure to a minimum exposure level. The implementation of this idea requires that in the pulse width modulation region, the division of the pixel period be divided into pulse widths on the order of several nanoseconds. If a pixel is 182 nanoseconds, this implies the smallest pulse width be 1 nanosecond. At present this is not realizable in a cost effective manner with the state of the art in electronic components.

The following patents, which have also disclosed the use of multiple modulation modes in laser recording systems, have not been completely successful in maximizing the exposure range of the laser and in reusing the laser region of a laser diode. U.S. Pat. No. 4,799,069, issued Jan. 17, 1989, inventors Sasaki et al.; U.S. Pat. No. 4,806,946, issued Feb. 21, 1989, U.S. Pat. No. 4,375,065, issued Feb. 22, 1983, inventor Ohara; U.S. Pat. No. 4,905,022, issued Feb. 27, 1990, inventor Nagashawa; U.S. Pat. No. 4,754,291, issued Jun. 29, 1988, inventor Horikawa; U.S. Pat. No. 4,679,057, issued Jul. 7, 1987, for Laser Recording Apparatus.

Thus, there exists in known laser printer apparatus a problem with expanding the exposure range of the laser diode without operating in the LED region of the laser diode.

SUMMARY OF THE INVENTION

According to the present invention, there is provided a solution to the problems of the prior art wherein laser imaging apparatus includes a laser diode wherein the linear laser region of operation of the laser is reused to increase the contrast ratio and exposure range and to minimize the undesirable effects of operating the laser diode in the non-linear operating region. According to an aspect of the present invention, the laser imaging apparatus includes a laser diode which is controlled to produce a laser beam, the power of which varies linearly as a function of a digital image input signal. The laser beam is deflected by scanning optics to expose photosensitive media, such as film. Control means are provided to control operation of the laser diode. When the digital image input signal has a value in a first range of values above a predetermined value, the control means controls the laser diode to operate in an amplitude modulation mode in its linear operating region. When the digital image input signal has a value in a second, lower range of values below the predetermined transition value, the control means controls the laser diode to operate in the linear region in a pulse amplitude modulation mode.

DESCRIPTION OF THE PREFERRED EMBODIMENTS

Figure 1:
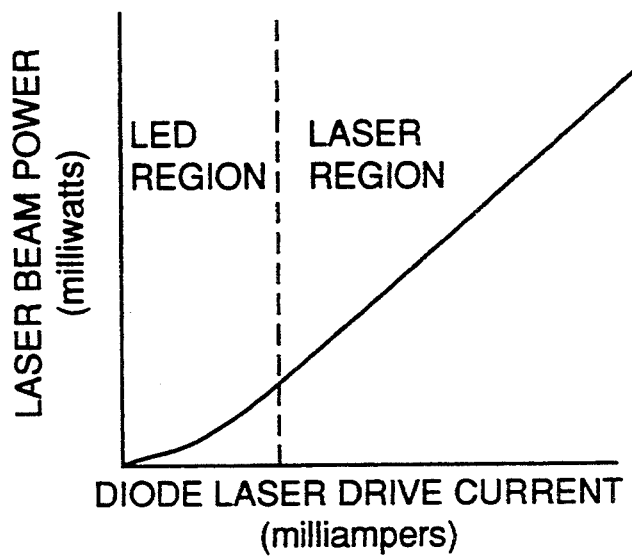
FIG. 1 is a graphical view illustrating the operating curve of a laser diode.
Figure 2:
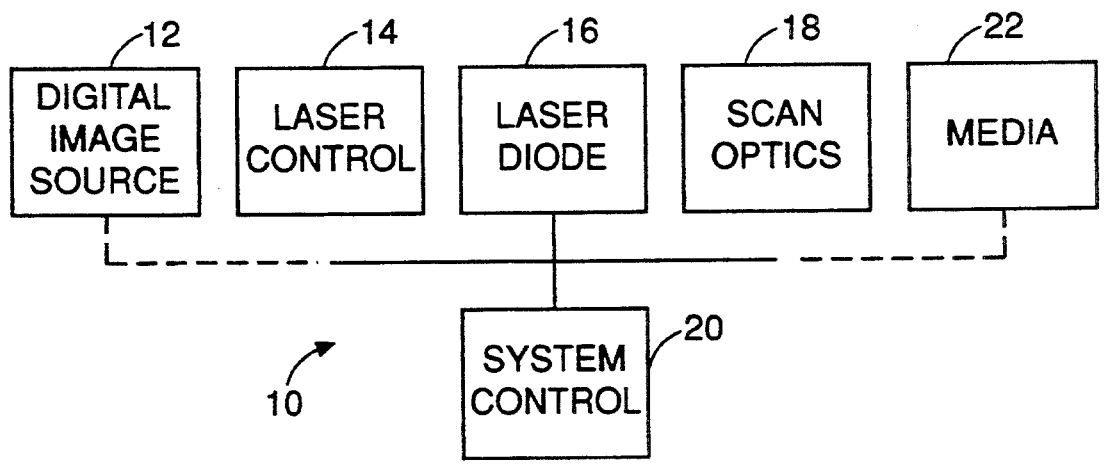
FIG. 2 is a block diagram of a laser imaging system including the present invention.

Referring now to FIG. 2, there is shown a laser imaging apparatus including an embodiment of the present invention. As shown, laser imaging apparatus 10 includes a digital image source 12, laser diode control 14, laser diode 16, scan optics 18, and system control 20. Digital image source 12 provides a digital image, such as a digital x-ray image, which is reproduced on photosensitive media 22 (such as film) by means of laser diode 16. Laser control 14 modulates laser diode 16 as a function of the digital image provided by source 12. Scan optics 18 scans the modulated laser beam onto media 22. System control 20 controls the operation of system 10.

Digital image source 12 may, for example, provide a digital x-ray image from (1) a medical imaging modality (CT, MRI, US, PET); (2) an x-ray film digitizer; (3) a storage phosphor system; (4) an image archival system (magnetic or optical).

Scan optics 18 shapes the laser beam from laser diode 16 and repetitively scans the laser beam onto media 22 as media 22 is moved past the scanning beam. Scan optics 18 may include an oscillating mirror, a rotating polygon mirror or a rotating holygon.

According to the present invention, the linear region of operation of the laser diode is reused to increase the contrast ratio and to reduce the undesirable effects associated with operating in the LED region of the laser. The invention increases contrast ratio by using amplitude modulation (AM) at high exposure levels and pulse amplitude modulation (PAM) at low exposure levels. PAM modulation is used to force the operation of laser diode 16 to be in the laser region (as opposed to the LED region) at all times during exposure.

Figure 3:
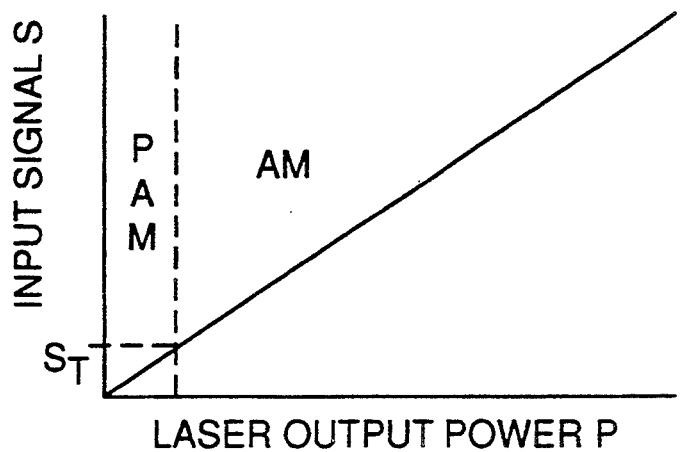
FIG. 3 is a graphical view of an input versus output curve of the laser imaging system of FIG. 2.

As shown in FIG. 3, when the input digital signal from source 12 is greater than a transition value $S_T$, the signal directly modulates laser diode 16 to produce an amplitude modulated laser beam. When the input signal from source is equal to or less than transition value $S_T$, then laser diode 16 is operated in a pulse amplitude modulation mode at a laser power above the threshold point.

Figure 4:
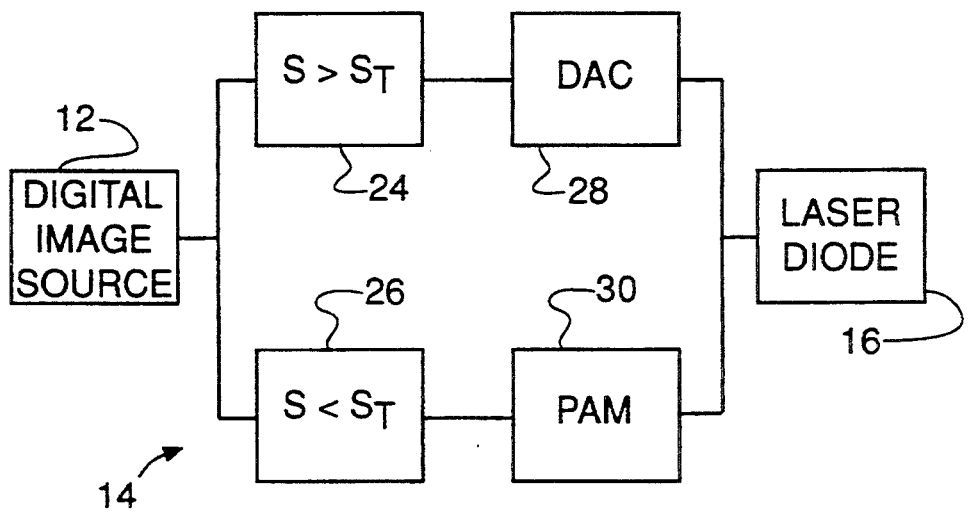
FIG. 4 is a block diagram of an embodiment of the present invention.

FIG. 4 shows an embodiment of laser control 14 for controlling laser diode 16. Laser control 14 includes comparators 24 and 26, digital to analog converter (DAC) 28 and pulse amplitude modulator circuit 30. Comparator 24 controls DAC 28 to modulate laser diode 16 in an AM mode when the digital signal S from source 12 has a value greater than $S_T$. Comparator 26 controls PAM circuit 30 in a pulse amplitude modulation mode when the digital signal from source 12 is less than or equal to $S_T$.

Figure 5:
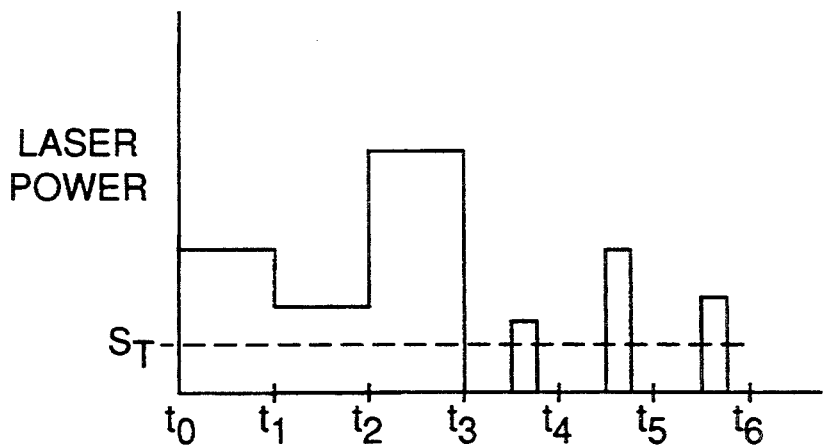
FIG. 5 is a graphical view useful in understanding the operation of the embodiment of FIG. 4.

The control signal, which is used to control laser diode 16, is illustrated in FIG. 5. During the pixel periods, $t_0 \to t_1$, $t_1 \to t_2$, $t_2 \to t_3$, the digital input signal from source 12 is greater than $S_T$ and therefore the control signal is a linear function of the digital image input signal and laser diode 16 is operated in an amplitude modulation mode. During the pixel periods, $t_3 \to t_4$, $t_4 \to t_5$, $t_5 \to t_6$, the digital input signal from source 12 is less than $S_T$, and the laser diode 16 is operated in the laser operating region, but in a pulse amplitude mode.

Figure 6:
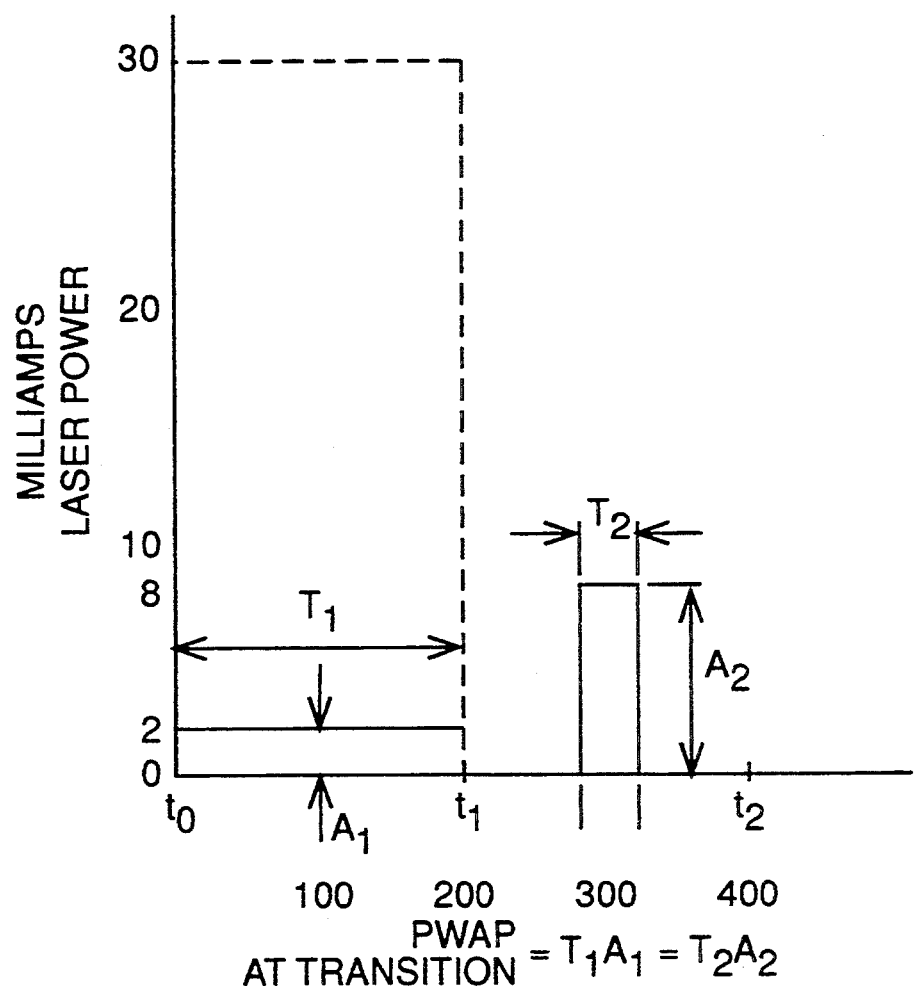
FIG. 6 is a graphical view illustrating the Pulse Width Amplitude Product transition from the AM mode to the PAN mode.

An example will be presented to illustrate the present invention. Assume a laser diode 16 with a 30 milliwatt maximum continuous output, which is in the laser mode of operation (i.e., amplitude modulation (AM)) from 2 milliwatt to 30 milliwatts. Assume a pixel period of 200 nanoseconds. In the linear region of operation, a 15 to 1 contrast ratio can be realized. At 2 milliwatt output and below the contrast is increased by implementation of a pulse amplitude modulation. To make a linear transition from the linear AM region to the pulse amplitude modulation region, the Pulse Width Amplitude Product (PWAP) must be matched. As shown in FIG. 6, PWAP is calculated for a pixel exposure which is at the threshold of change from AM to PAM. The PWAP must be matched to that of a pulse (or series of pulses) in a PAM pixel at the transition to PAM.

Continuing with the example, the amplitude of exposure power at the transition to PAM but still in AM is 2 milliwatts. This results in a PWAP=400 mW-nS.

Let the pulse amplitude (Apulse) at transition be 8 milliwatts, and use 1 pulse of amplitude 8 milliwatts, and period 50 nanoseconds. This results in a PWAP of 400 mW-nS, which is matched to the PWAP in the AM mode at the transition to the PAM mode. In the PAM mode of operation the contrast ratio 4 is the ratio of 8 to 2 milliwatts. The overall contrast ratio is the product of $15 \times 4 = 60$. The PAM mode is operated by reducing pulse amplitude to the minimum power level used for amplitude modulation (i.e. 2 milliwatts), but maintaining the pulse period at 50 nanoseconds. This implies an equivalent minimum exposure power of $$2 \text{ mW} \times 1 \text{ pulse} \times 50 \text{ (nS/pulse)}/200$$
$$\text{(nS/pixel)} = 0.500 \text{ mW/pixel}.$$

It is also within the scope of the invention to operate in the pulse amplitude mode using more than one pulse per pixel period. In the example given, for example, two pulses each having 25 nanoseconds period or five pulses each having 10 nanoseconds period, could be used in place of one pulse with a fifty nanosecond period.

Figure 7:
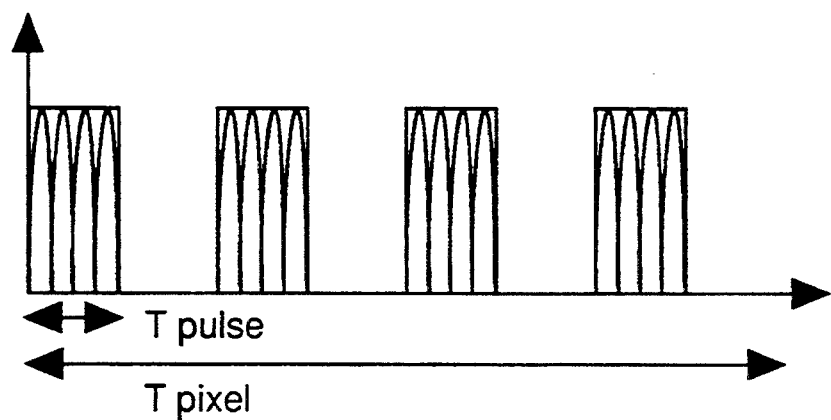
FIG. 7 is a diagrammatic view illustrating the RF injection technique.

The characteristics in the non-linear LED region can be improved in all of the embodiments by the use of the injection of an RF (Radio Frequency) signal at an average level into the laser diode 16. RF injection reduces laser beam divergence, and reduces the shift in wavelength typically observed at output illuminative powers close to and in the LED region of operation. It effectively extends the laser region of operation into the LED region by pumping the laser hard enough to sustain a population inversion at output powers which, without the use of RF injection would be in the LED region of operation. RF injection could be used in the AM mode and in the pulse amplitude modulation mode. FIG. 7 illustrates the use of RF injection in a pulse.

If for example, a 30 milliwatt laser has a 2 milliwatt transition point, and RF injection extended the laser region of operation to 0.5 milliwatts, it would result in a factor of 4 improvement in operation and the contrast ratio would be improved from 15 to 60 using AM alone.

When using a single pulse in a pixel period, the pulsed laser beam profile may not have sufficient overlap with the adjacent pixel exposure to prevent sub-pixel density variations. When sub-pixel density variations appear in the same place in a number of adjacent lines, the resulting macroscopic effect is visible bands which are an objectionable image feature. Random distribution of the pulse location within the pixel period is used to prevent this undesirable effect.

The disclosed invention has industrial application in laser printers used in medical imaging systems.

Although the invention has been described with reference to preferred embodiments thereof, it will be understood that variations and modifications can be effected within the spirit and scope of the invention as described above and as defined in the appended claims.

What is claimed is:

1. A laser imaging apparatus comprising:
    a laser diode which is operable in a linear laser region and a lower nonlinear LED region;
    means for applying to said laser diode a digital image input signal having a first range of digital values above a predetermined transition value which would operate said laser diode in said linear region and having a second lower range of digital values below said predetermined transition value which would operate said laser diode in said nonlinear region; and
    control means for controlling said laser diode to operate in an amplitude modulation (AM) mode in said linear operating region, when said digital image input signal has a value in said first range of values, and to operate in a pulse amplitude modulation (PAM) mode in said linear region, when said digital image input signal has a value in said second range of values.

2. The apparatus of claim 1 wherein said control means includes comparator means for comparing the value of said input digital signal to a predetermined transition value, such that when said compared value is greater than said predetermined transition value, said laser diode is controlled to operate in said amplitude modulation mode and when said compared value is less than said predetermined transition value, said laser diode is controlled to operate in said pulse amplitude modulation mode.

3. The apparatus of claim 1 wherein said predetermined transition value between said linear region and said nonlinear region is lowered by injecting an RF (radio frequency) signal into said AM mode signal.

4. The apparatus of claim 3 wherein said RF signal is injected into said PAM mode signal.

5. The apparatus of claim 1 wherein in said PAM mode said pulse location within a pixel period is randomly distributed within the pixel period to minimize banding effects.

* * * * *